United States Patent [19]

Hüttemann et al.

[11] 4,228,366
[45] Oct. 14, 1980

[54] INTEGRATOR CIRCUIT WITH LIMITER

[75] Inventors: Werner Hüttemann, Herrenberg-Kuppingen; Reinhard Falke, Altdorf, both of Fed. Rep. of Germany

[73] Assignee: Hewlett-Packard Company, Palo Alto, Calif.

[21] Appl. No.: 926,788

[22] Filed: Jul. 21, 1978

[30] Foreign Application Priority Data

Aug. 19, 1977 [DE] Fed. Rep. of Germany ....... 2737432

[51] Int. Cl.³ .................... H03K 5/08; G06G 7/184
[52] U.S. Cl. .................... 307/229; 307/228; 307/237; 307/261; 328/127; 328/171
[58] Field of Search .............. 307/228, 237, 261, 229; 328/35, 127, 171, 173, 183, 184, 185

[56] References Cited

U.S. PATENT DOCUMENTS

| 3,395,293 | 7/1968 | Perloff | 307/228 |
| 3,541,352 | 11/1970 | Merrill et al. | 307/228 X |
| 3,979,598 | 9/1976 | Lach | 307/228 X |

Primary Examiner—John Zazworsky
Attorney, Agent, or Firm—A. C. Smith

[57] ABSTRACT

An integrator circuit is disclosed, comprising a capacitor, at least one connectable and disconnectable power source for charging and discharging the capacitor, and a limiter device comprising diodes for limiting the capacitor voltage to a predetermined value. The limiter device can be separated from the remaining integration circuit, thus avoiding the effect resulting from the current/voltage characteristic of the diodes, particularly undesirable voltage discontinuity.

2 Claims, 3 Drawing Figures

INTEGRATOR CIRCUIT WITH LIMITER

BACKGROUND OF THE INVENTION

Integrator circuits of the type described herein are for instance used for forming pulses. They enable rising and dropping portions of predetermined slopes to be generated, with a zone of constant voltage defined by the limitation arranged therebetween.

There exist essentially two different ways of obtaining such limitation. In the case of the active limitation, a control circuit is activated to maintain the voltage at the capacitor constant, when the limit voltage has been reached. For this purpose, the amplification of the control circuit must be kept low to allow rapid transient of the control circuit. However, this means that the limiting voltage does not remain constant and that the difference between the start and the final value of the limitation is relatively high.

In the case of the passive limitation, a clamping circuit with diodes is used which receives the constant current previously supplied to the capacitor after the clamping voltage has been reached. However, the particular current/voltage characteristic of the diodes results in a voltage discontinuity during the transition from the constant clamping voltage to the dropping slope (discharge of the capacitor), and as a result thereof the pulse shape becomes inaccurate. Although this voltage discontinuity can be avoided by passing the pulse through an additional limiter circuit which clips off the inaccurate portion of the pulse, such procedure offers the disadvantage that the contant-voltage time varies with any change of the slope of the rising and/or dropping portion. However, in many applications, it is desired that this contant-voltage section should remain uniformly long even if the slope should be varied.

SUMMARY OF THE INVENTION

It is an object of the present invention to provide an integrator circuit using a limiter device comprising diodes and supplying accurate transitions between the sloping portions and the constant-voltage portion, while eliminating any variations of the length of the constant-voltage portion when the slope steepness is varied.

According to the invention an integrator circuit is provided, comprising a capacitor, at least one connectable and disconnectable power source for charging and discharging the capacitor, and a limiter device comprising diodes for limiting the capacitor voltage to a predetermined value. The limiter device can be separated from the remaining integration circuit, thus avoiding the effect resulting from the current/voltage characteristic of the diodes, particularly undesirable voltage discontinuity.

DESCRIPTION OF THE PREFERRED EMBODIMENTS

Figure 1:
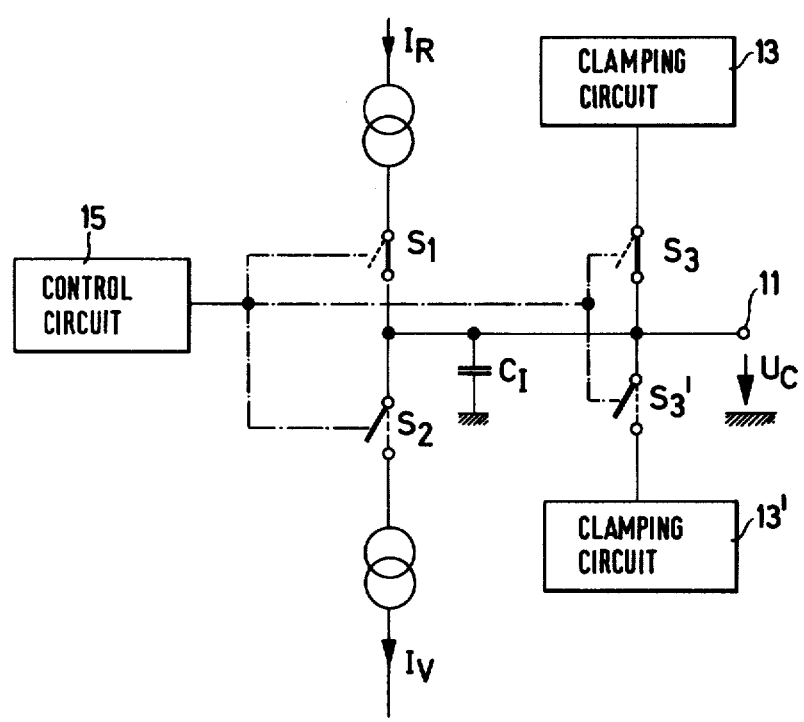
FIG. 1 shows a basic circuit diagram of an integrator in accordance with the invention.

FIG. 1 shows an integration capacitor $C_I$ that can be charged and/or discharged via current sources $I_R$ and $I_V$. The capacitor voltage $U_c$ can be kept at an output terminal 11. Clamping circuits 13 and 13' prevent the capacitor voltage $U_c$ from rising above a predetermined value $\pm U_{cmax}$. Both the two current sources $I_R$ and $I_V$ and the clamping circuits 13 and 13' can be connected to the integration capacitor $C_I$ via switches $S_1$, $S_2$ and $S_3$ or $S_3'$. The switches $S_1$, $S_2$, $S_3$ and $S_3'$ can be actuated by means of a control circuit 15.

Figure 2:
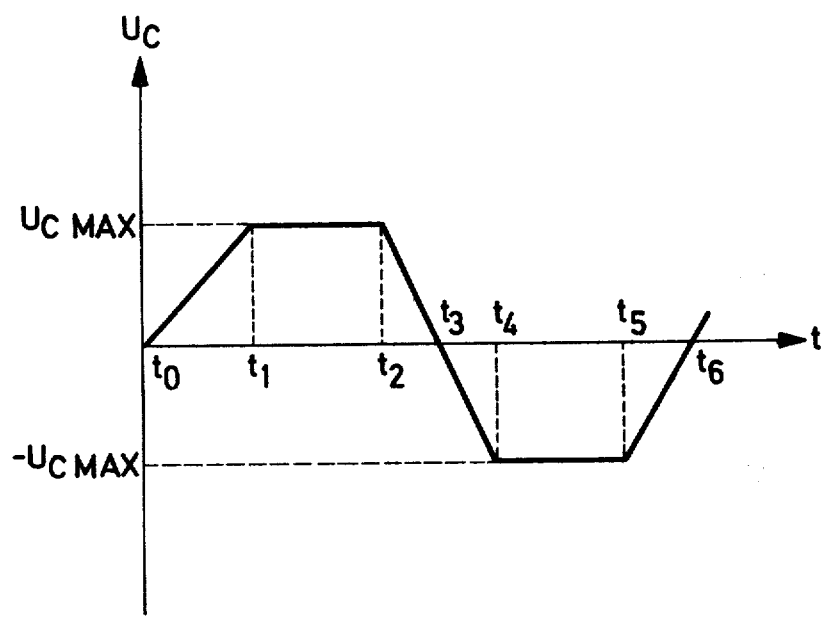
FIG. 2 shows the output voltage/time curve of the circuit shown in FIG. 1.

Now, the switching sequence will be described in connection with FIG. 2, which shows the curve of the output voltage $U_c$ related to time. At the moment $t_o$ the switches $S_1$ and $S_3$ are closed, whereas the switches $S_2$ and $S_3'$ remain open. This is the condition shown in FIG. 1. Then the capacitor $C_I$ is charged via the current source $I_R$ (FIG. 1) and as a result a sloping rise of the voltage $U_c$ is achieved until the clamping voltage $U_{cmax}$ is reached at the moment $t_1$. Thereafter, this voltage is maintained until the moment $t_2$.

At the moment $t_2$, the switches $S_1$ and $S_3$ are opened, whereas the switch $S_2$ is closed, when the capacitor C is discharged via the current source $I_V$, and as a result a sloping drop of the voltage U is achieved until the value zero is reached at the moment $t_3$. About this moment, the switch $S_3'$ is closed. The capacitor $C_I$ continues to be negatively charged and the voltage $U_c$ continues to drop until the negative clamping voltage $U_{cmax}$ is reached at the moment $t_4$. This voltage is then maintained until the moment $t_5$.

At the moment $t_5$, the switches $S_2$ and $S_3'$ are opened, whereas the switch $S_1$ is closed. As a result, the capacitor $C_I$ is again positively charged via $I_R$. At about the moment $t_6$, the switch $S_3$ is closed again, and the operating cycle starts with the moment $t_0$.

Figure 3:
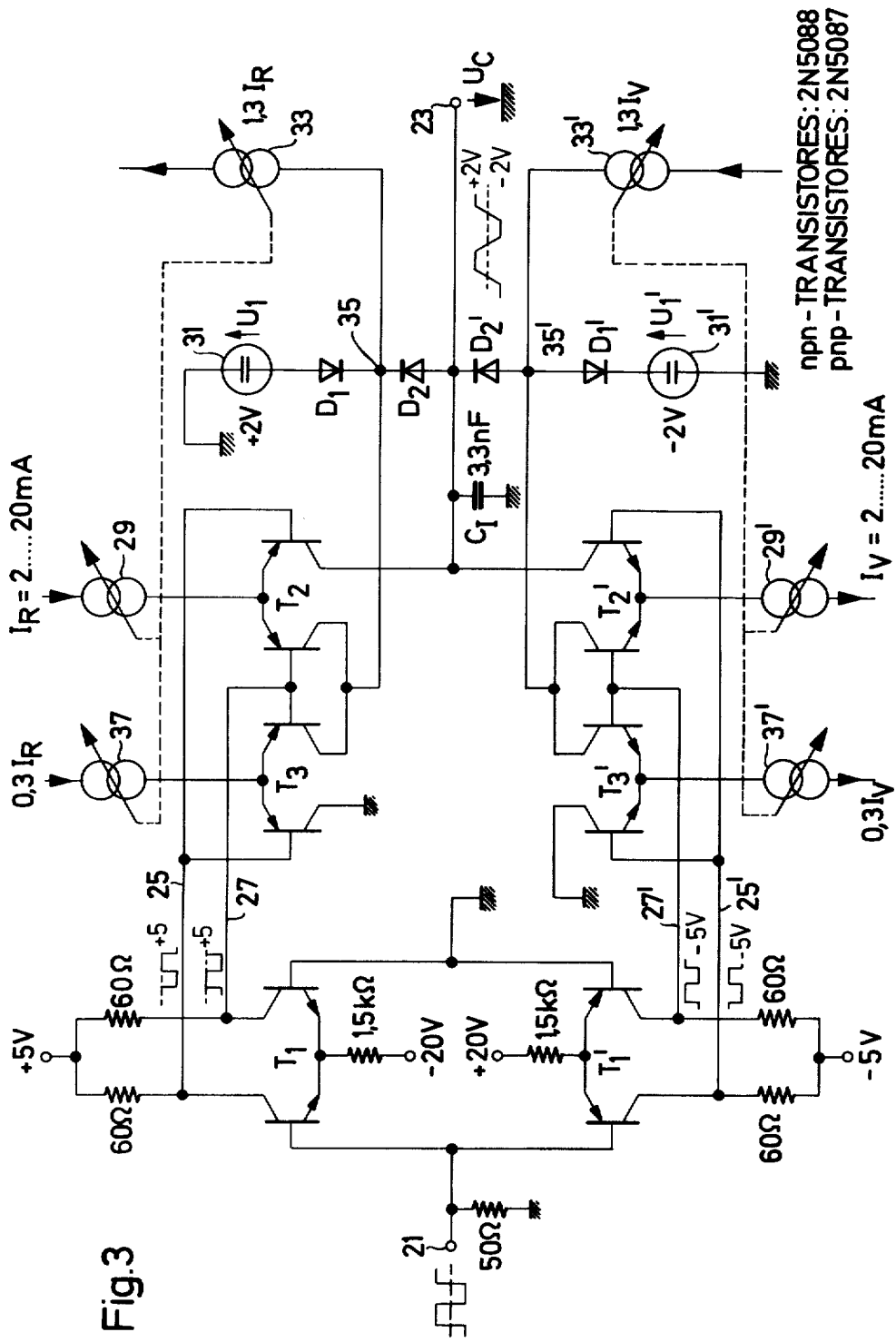
FIG. 3 shows a detailed circuit diagram of a preferred embodiment of the invention.

FIG. 3 shows the circuit of a preferred embodiment of the present invention. Again, the integration capacitor is marked with the reference $C_I$. Its voltage $U_c$ can be tapped at an output terminal 23. Charging and discharging of the integration capacitor $C_I$ is effected with currents $I_R$ and/or $I_V$ supplied by current sources 29 and/or 29'.

An input terminal 21 is supplied with a symmetrical switching signal (square signal) from a control circuit not shown in the drawings. This signal reaches one base each of two transistor pairs $T_1$ and/or $T'_1$ acting as differential amplifiers. The other base of each such transistor pairs is connected to earth. The transistor pairs $T_1$ and $T'_1$ generate on lines 25 and 25' signals of opposite phase, and on lines 27 and 27' signals in equal phase in relation to the input signal at the terminal 21. The complementary signals on the lines 25 and 27 are supplied also to a transistor pair $T_2$. A low signal level on line 25 (and simultaneously a high signal level on line 27) causes the current $I_R$ of a current source 29 to be supplied to an integration capacitor $C_I$ so that the latter is charged. The voltage $U_c$ at the integration capacitor $C_I$ can be tapped at a terminal 23.

If one assumes that during the charging of $C_I$ the voltage $U_c$ is lower than the voltage $U_1$ of a current source 31, the diode $D_2$ is non-conductive, and a current source 33 with 1.3 $I_R$ draws current from the current source 31, via a diode $D_1$. As soon as the voltage $U_c$ becomes equal to the voltage $U_1$ the diode $D_2$ becomes conductive, and the current $I_R$ from the current source 29 is supplied to the current source 33 (1.3 $I_R$) via diode $D_2$. Now, the charging of the integration capacitor $C_I$ is discontinued, and its voltage remains constant, which means that a clamped condition is obtained.

Now, when the signal level on lines 25 and 27 changes, the transistor pair $T_2$ switches over, the current $I_R$ which previously passed the diode $D_2$, is now supplied to the connection point 35 between the diodes $D_1$ and $D_2$. At the same time, this connection point is simultaneously supplied via the transistor pair $T_3$ with the current $0.3\ I_R$ from a current source 37, which was previously discharged to earth by the transistor pair $T_3$. As connection point 35 is now supplied with a current equal to that discharged by it ($1.3\ I_R$ in both cases), no current can flow through the diode $D_2$, and thus the clamping circuit is separated from the integration capacitor $C_I$.

At the same time, the transistor pair $T'_2$ connects a current source 29' ($I_V$) with the integration capacitor $C_I$ so that the latter is discharged. The function of the lower half of the circuit shown in FIG. 3 is basically identical to that of the upper circuit portion with the exception that the components ($T_1'$, $T_2'$, $T_3'$, $D_1'$, $D_2'$ in relation to $T_1$, $T_2$, $T_3$, $D_1$, $D_2$), the currents ($I_V$ in relation to $I_R$) and the voltages ($U_1'$ in relation to $U_1$) are oppositely directed or orientated. The signals on lines 25' and 27' are equal in phase to those on lines 25 and 27. In the embodiment shown in the drawing, the output voltage $U_c$ at the terminal 23 shows a trapezoidale curve (as shown in FIG. 2) with constant portions of +2 volt and −2 volt, between which linear sloping portions are encountered the steepness of which can be varied by corresponding changes to the currents $I_R$ and/or $I_V$.

We claim:

1. An integrator circuit comprising:
   a capacitor;
   source means of current for charging and discharging the capacitor;
   means connecting and disconnecting the source means and the capacitor;
   limiter means including diodes connected to limit the capacitor voltage to a predetermined value; and
   control means for simultaneously disconnecting the limiter means from the capacitor and connecting thereto the source means for charging the capacitor.

2. An integrator circuit in accordance with claim 1 wherein the limiter means includes a signal source and said diodes connected in series therewith and having a common connection point therebetween connected to said capacitor with said diodes orientated in opposite conduction directions with respect to said connection point;
   current source means for supplying a current higher than that supplied by the source means; and
   said control means simultaneously connects and disconnects the source means and said current source means to said capacitor in phase opposition to maintain the sum of the currents supplied to said connection point substantially zero and to render non-conductive the diode which limits the capacitor voltage to the predetermined value.

* * * * *